(12) United States Patent
Kudo et al.

(10) Patent No.: US 7,663,225 B2
(45) Date of Patent: Feb. 16, 2010

(54) METHOD FOR MANUFACTURING ELECTRONIC COMPONENTS, MOTHER SUBSTRATE, AND ELECTRONIC COMPONENT

(75) Inventors: Kazuhide Kudo, Sagamihara (JP); Minoru Matsunaga, Echizen (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 238 days.

(21) Appl. No.: 10/599,368

(22) PCT Filed: May 27, 2005

(86) PCT No.: PCT/JP2005/009779

§ 371 (c)(1),
(2), (4) Date: Sep. 27, 2006

(87) PCT Pub. No.: WO2006/011291

PCT Pub. Date: Feb. 2, 2006

(65) Prior Publication Data
US 2007/0199734 A1 Aug. 30, 2007

(30) Foreign Application Priority Data
Jul. 23, 2004 (JP) .............................. 2004-216029

(51) Int. Cl.
*H01L 41/083* (2006.01)
*H01F 17/00* (2006.01)
*H01F 27/00* (2006.01)
*H01F 27/28* (2006.01)
*H05K 7/06* (2006.01)
*H05K 3/02* (2006.01)
*H05K 3/10* (2006.01)
*H05K 3/36* (2006.01)

(52) U.S. Cl. .................. 257/700; 438/960; 29/830; 29/847; 156/89.12

(58) Field of Classification Search .......... 257/E25.001, 257/E25.002, E25.029, E25.023, E25.025, 257/E25.026, E25.027, E25.03, E23.179, 257/E23.003, 107, 118, 700; 438/455, 458, 438/926, 460; 29/830, 846, 847; 156/89.12
See application file for complete search history.

(56) References Cited

U.S. PATENT DOCUMENTS
2002/0093415 A1* 7/2002 Kitamura .................... 336/200

FOREIGN PATENT DOCUMENTS
JP 05-198439 A 8/1993
(Continued)

OTHER PUBLICATIONS
Machine Translation of JP 2000012377 A attached.*
(Continued)

*Primary Examiner*—M. Wilczewski
(74) *Attorney, Agent, or Firm*—Keating & Bennett, LLP (57) ABSTRACT

In a manufacturing process of electronic components which include conductive patterns laminated with insulating layers provided therebetween, conductive pattern layers having conductive patterns formed at intervals therebetween along layer surfaces and insulating layers are alternately laminated to each other. The laminate is pressed by applying a force thereto in the lamination direction, followed by cutting of the laminate along cutting lines provided along boundaries between the electronic components, so that the electronic components are separated from each other. In a cutting-removal region of a mother substrate from which the electronic components are separated from each other by cutting, removal dummy patterns having a size allowing it to be disposed within the above region are formed. In the electronic component, floating dummy patterns which are not electrically connected to the conductive patterns are formed at intervals from the cutting-removal region.

16 Claims, 5 Drawing Sheets

FOREIGN PATENT DOCUMENTS

| | | |
|---|---|---|
| JP | 07-122430 A | 5/1995 |
| JP | 09-289128 A | 11/1997 |
| JP | 11-243017 A | 9/1999 |
| JP | 2000012377 A * | 1/2000 |
| JP | 2003-158376 A | 5/2003 |
| JP | 2004-140587 A | 5/2004 |
| JP | 2004-186343 A | 7/2004 |
| JP | 2006/041184 * | 2/2006 |

OTHER PUBLICATIONS

Official communication issued in the Korean Application No. 10 2006 7014638, mailed on Jul. 24, 2007.

International Search Report issued in the corresponding International Application No. PCT/JP2005/009779, mailed on Aug. 9, 2005.

Official communication issued in counterpart Chinese Application No. 200580003768.3, mailed on Jun. 5, 2009.

* cited by examiner

METHOD FOR MANUFACTURING ELECTRONIC COMPONENTS, MOTHER SUBSTRATE, AND ELECTRONIC COMPONENT

BACKGROUND OF THE INVENTION

1. Field of the Invention

The present invention relates to a method for manufacturing electronic components including conductive patterns that are laminated to each other with insulating layers provided therebetween, to a mother substrate, and to an electronic component.

2. Description of the Related Art

Figure 5A:
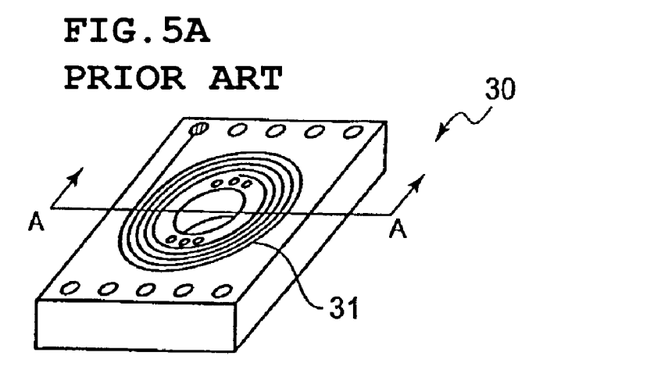
FIG. 5A is a model view showing an example of a related coil component.
Figure 5B:
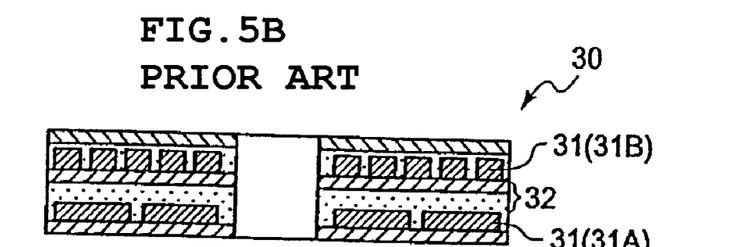
FIG. 5B is a schematic cross-sectional view of the coil component shown in FIG. 5A taken along a line A-A.

In FIG. 5A, one example of a coil component is shown by a schematic perspective view. In FIG. 5B, a schematic cross-sectional view of the coil component in FIG. 5a taken along a line A-A is shown (for example, see Patent Document 1). This coil component 30 includes coiled conductive patterns 31 (31A and 31B) that are laminated to each other with an insulating layer 32 provided therebetween.

Figure 6A:
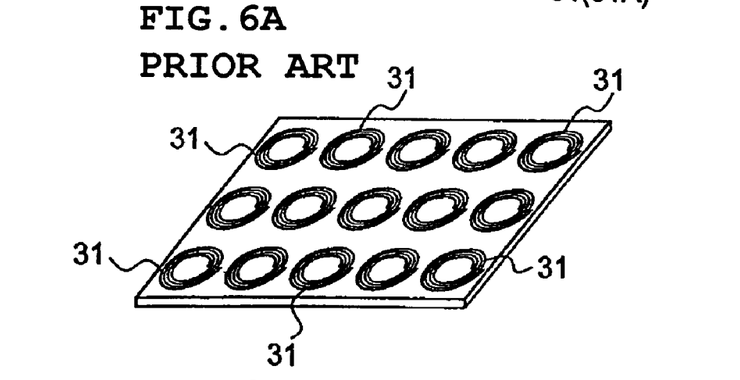
FIG. 6A is a view for illustrating an example of one manufacturing step of related coil components.
Figure 6B:
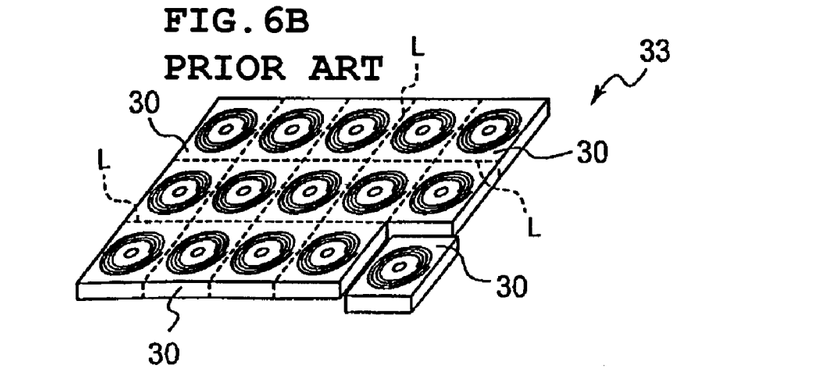
FIG. 6B is a view for illustrating an example of one step for manufacturing coil components, following the step shown in FIG. 6A.

The coil component 30 is manufactured as described below. As shown in FIG. 6A, a conductive pattern layer is formed which includes the conductive patterns 31 provided at intervals therebetween on the same plane. Conductive pattern layers are laminated to each other with the insulating layer 32 provided therebetween, so that a laminate 33 as shown in FIG. 6b is formed. This laminate 33 is a laminate in which the coil components 30 are collectively formed. After being formed, the laminate 33 is cut along cutting lines L provided along boundaries between the individual coil components 30, so that the coil components 30 are separated from each other. Through the manufacturing process thus described, the coil components 30 are manufactured.

Another example of a related coil conductor is disclosed in Japanese Unexamined Patent Application Publication No. 7-122430 (Patent Document 1).

Figure 7:
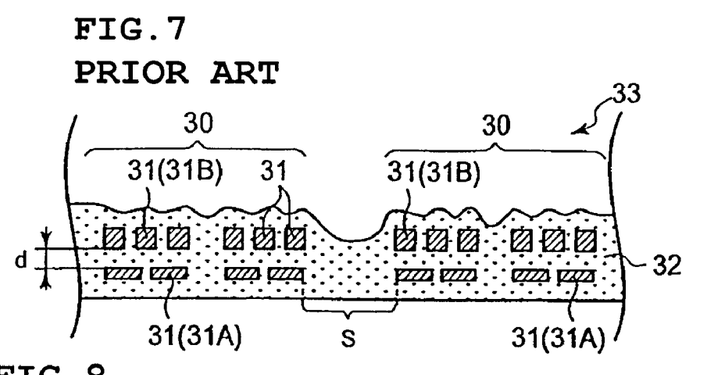
FIG. 7 is a model view for illustrating a problem of a conventional manufacturing process.

In the laminate 33 formed in a process for manufacturing the coil components 30, for example, as shown in a schematic cross-sectional view of FIG. 7, a large gap S is formed between adjacent conductive patterns 31 of the coil components 30. Thus, a large amount of an insulating material is provided in the gap S formed between the conductive patterns 31 from the insulating layer 32. Consequently, for example, a problem may arise in that a gap d between the conductive patterns 31A and 31B in the lamination direction is decreased more than that originally designed or in that the gap d between the conductive patterns 31A and 31B varies. Therefore, the electrical properties of the coil component 30 are varied, and as a result, it has been difficult to improve the reliability of the performance of the coil component 30.

Figure 8:
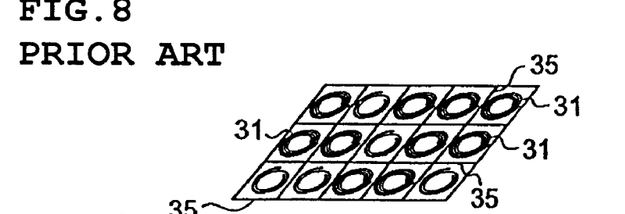
FIG. 8 is a model view for illustrating an example of another conventional manufacturing process of coil components.

Accordingly, a method shown in FIG. 8 has been proposed. According to this proposed method, in order to form a conductive pattern layer of the laminate 33, the electronic component-forming conductive patterns 31 are formed, and in addition, a dummy pattern 35 which is not electrically connected to the conductive patterns 31 is formed along cutting lines. With the formation of the dummy pattern 35 as described above, the amount of a conductive pattern formed in the gap S between adjacent conductive patterns 31 of the coil components 30 is increased. Thus, the amount of the insulating material provided in the gap S from the insulating layer 32 is decreased. As a result, the gap d between the conductive patterns 31A and 31B can be formed substantially as originally designed.

Figure 9A:
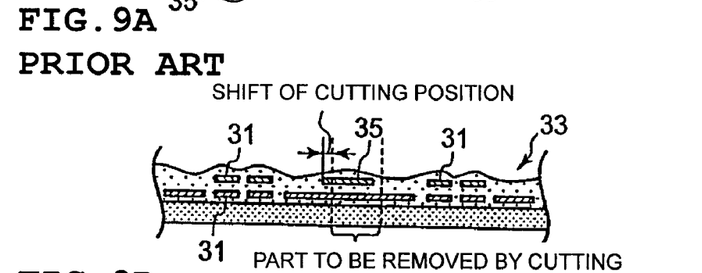
FIG. 9A is a model view for illustrating a problem of the example of the manufacturing process of coil components, which is illustrated with reference to FIG. 8.

However, for example, with the formation of the dummy pattern 35, the following problems may arise. The purpose of the dummy pattern 35 is to increase the amount of the conductive pattern formed in the gap S between the adjacent conductive patterns 31 of the coil components 30. In view of this purpose, the dummy pattern 35 preferably has a large width. However, when the dummy pattern 35 is formed to have a large width, the following problems may occur. In the case in which the dummy pattern 35 is formed to have a large width, even when the position at which the dummy pattern 35 is to be formed is only slightly shifted, the dummy pattern 35 enters a region in which the electronic component is to be formed from a region which is to be cut and removed when the laminate 33 is processed by cutting. In this case, as shown in a cross-sectional view of FIG. 9B, a portion of the dummy pattern 35 may disadvantageously remain in the coil component 30 which is separated from the laminate 33. In addition, when the dummy pattern 35 is formed to have a large width, when the cutting position is shifted while the laminate 33 is being cut as shown in FIG. 9A, a portion of the dummy pattern 35 is likely to remain in the coil component 30 which is separated from the laminate 33 as shown in a cross-sectional view of FIG. 9B. The cut surface of the dummy pattern 35 is exposed at the side surface of the coil component 30. This remaining dummy pattern 35 causes the following problems.

The coil component 30 separated from the laminate 33 may be processed by plating for surface treatment in some cases, and in this case, plating is disadvantageously and unnecessarily performed onto the exposed portion of the dummy pattern 35. In addition, when a voltage is applied to the dummy pattern 35, and a potential difference is generated between the conductive pattern 31 and the dummy pattern 35, migration occurs between the dummy pattern 35 and the conductive pattern 31, thereby causing a problem of degradation in electrical properties of the coil component 30.

To prevent the problems described above, when the dummy pattern 35 is formed to have a small width, a problem may occur in that delamination (peeling between layers) is generated as described below. That is, when the dummy pattern 35 is formed, a convex portion in conformity with the shape of the dummy pattern 35 is formed at the upper surface of the laminate 33 in a region in which the dummy pattern 35 is formed. In addition, at each of two sides of the convex portion, the insulating layer is provided in a gap between the dummy pattern 35 and the conductive pattern 31 adjacent thereto. As a result, a concave portion is formed. As the width of the dummy pattern 35 is decreased, the gap between the dummy pattern 35 and the conductive pattern 31 adjacent thereto is increased, and the depression of the insulating layer therebetween is increased. Consequently, as shown in a schematic cross-sectional view of FIG. 10, in the laminate 33, the height difference between the top portion of a convex 36 formed in conformity with the dummy pattern 35 and the bottom portion of a concave portion 37 formed at each of the two sides of the convex portion 36 is increased. In addition, when the width of the dummy pattern 35 is decreased, the width of the convex portion 36 is also decreased in conformity with the width of the dummy pattern 35. Thus, in a step of pressing the laminate 33 which is performed before the laminate 33 is separated by cutting, a large pressing force is applied to the thin convex portion 36.

Figures 9B, 10:
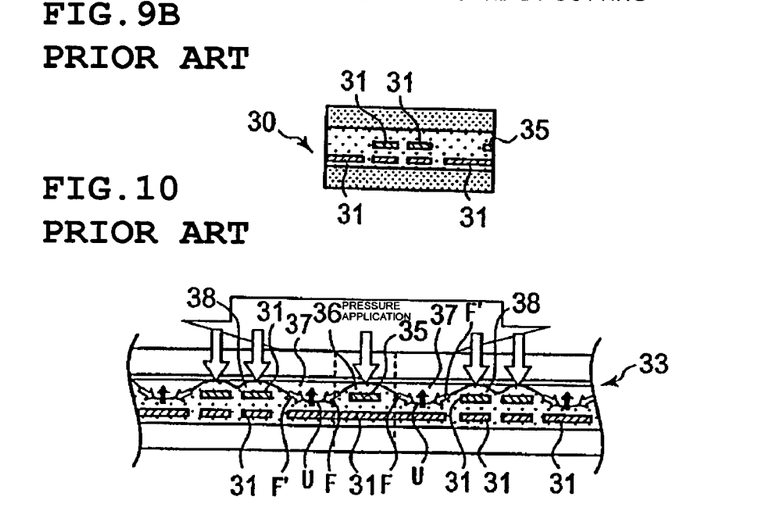
FIG. 9B is a model view for illustrating a problem of the manufacturing process of coil components, which is illustrated with reference to FIG. 8, together with FIG. 9A.
FIG. 10 is a model view for illustrating another problem of the manufacturing process of coil components, which is illustrated with reference to FIG. 8.

As shown by an arrow F in FIG. 10, the large pressing force applied to this convex portion 36 propagates to the bottom portion (that is, a portion having a small layer thickness) of the concave portion 37. In addition, a convex portion 38 caused by the conductive pattern 31 is also formed at the upper surface of the laminate 33, and in the step of pressing the laminate 33, as shown by an arrow F' in FIG. 10, a pressing force applied to the convex portion 38 also propagates to the bottom portion of the concave portion 37. As described above, since the forces F and F' facing each other are applied to the portion having a small layer thickness, an upward force shown by an arrow U in FIG. 10 is generated at the portion having a small layer thickness and a small strength. As a result, delamination (peeling between layers) may occur such that the insulating layer is peeled away from the conductive patterns located thereunder. Accordingly, the electrical properties of the coil component 30 are seriously degraded, and the components may be disadvantageously rejected as defective.

SUMMARY OF THE INVENTION

To overcome the problems described above, preferred embodiments of the present invention provide a method for manufacturing electronic components, in which conductive pattern layers are laminated to each other with insulating layers provided therebetween to form an integrated laminate, including the steps of alternately laminating the insulating layers and conductive pattern layers having conductive patterns which are formed at intervals therebetween in layer surface directions to form a laminate in which laminate portions of electronic component-forming conductive patterns are collectively formed, after a force is applied to the laminate in the lamination direction to form the integrated laminate, cutting the laminate along cutting lines provided along boundaries of the laminate portions of the electronic component-forming conductive patterns so as to separate the electronic components from each other, forming at least one removal dummy pattern in at least one of the conductive pattern layers which are to be laminated to each other before an insulating layer is provided on a surface of the at least one of the conductive pattern layers, the removal dummy pattern having a size allowing it to be placed within a cutting-removal region which is a region to be cut and removed by the step of cutting the laminate, and forming at least one floating dummy pattern in at least one conductive pattern layer of the laminate portions of the electronic component-forming conductive patterns so as to be disposed in the vicinity of the outside of the cutting-removal region at an interval therefrom before an insulating layer is formed by lamination on a surface of the at least one conductive pattern layer, the floating dummy pattern not being electrically connected to the electronic component-forming conductive patterns.

In accordance with a preferred embodiment of the present invention, a mother substrate is provided for forming many electronic components, including conductive pattern layers having conductive patterns which are arranged at intervals therebetween in layer surface directions, and insulating layers which are alternately laminated with the conductive pattern layers to define a laminate in which laminate portions of electronic component-forming conductive patterns are collectively formed, the laminate being cut along cutting lines provided along boundaries of the laminate portions of the electronic component-forming conductive patterns so as to separate the electronic components from each other. In at least one of the conductive pattern layers which are to be laminated to each other, at least one removal dummy pattern is provided having a size that allows it to be placed within a cutting-removal region which is to be cut away along the cutting lines, and in at least one conductive pattern layer of the laminate portions of the electronic component-forming conductive patterns, at least one floating dummy pattern which is not electrically connected to the electronic component-forming conductive patterns is provided in the vicinity of the outside of the cutting-removal region at an interval therefrom.

In accordance with another preferred embodiment of the present invention, an electronic component is provided which includes conductive pattern layers, and insulating layers which are alternately laminated with the conductive pattern layers to define a laminate in which the conductive pattern layers are integrally laminated to each other. In at least one of the conductive pattern layers which are laminated to each other, at least one floating dummy pattern which is not electrically connected to a corresponding conductive pattern is disposed in a region between an end surface of the at least one of the conductive pattern layers and the conductive pattern at an interval therefrom so as not to be exposed at the end surface of the at least one of the conductive pattern layers.

In a method for manufacturing electronic components, according to preferred embodiments of the present invention, when insulating layers and conductive pattern layers having conductive patterns which are formed at intervals therebetween in layer surface directions are alternately laminated to form a laminate in which laminate portions of electronic component-forming conductive patterns are collectively formed, electronic component-forming conductive patterns are formed in at least one of the conductive pattern layers which are to be laminated to each other, and at positions at which the conductive patterns are not formed, removal dummy patterns and floating dummy patterns are formed. Accordingly, in accordance with the formation of the removal dummy patterns and the floating dummy patterns, the amount of the pattern formed at positions at which the electronic component-forming conductive patterns are not formed is increased. In other words, the gap between the patterns in the layer surface direction is decreased. As a result, the amount of an insulating material for the insulating layers in the gap between the patterns in the layer surface direction is decreased. Thus, the gap between the conductive patterns in the lamination direction is easily obtained substantially as designed.

In addition, in the method for manufacturing electronic components, according to preferred embodiments of the present invention, since the amount of an insulating material for the insulating layer in the gap between the patterns in the layer surface direction is decreased, the irregularities of the upper surface of the laminate formed from the conductive pattern layers and the insulating layers are reduced, and the upper surface of the laminate is planarized. Accordingly, in a step of pressing the laminate, a pressing force is approximately uniformly applied to the whole laminate, and the generation of delamination is prevented.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the figures.

Figure 2A:
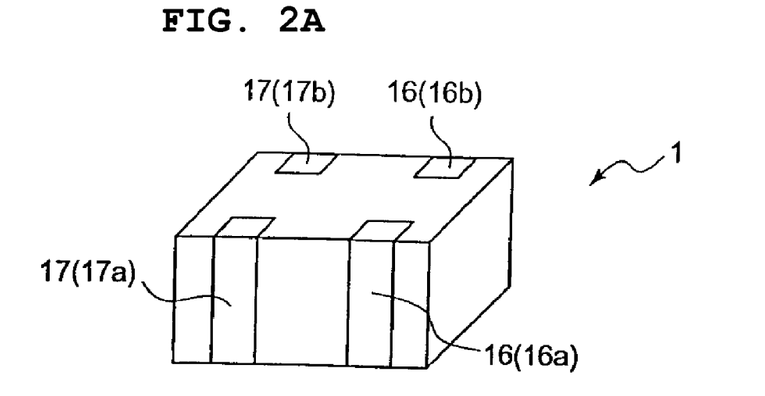
FIG. 2A is a perspective view schematically showing an electronic component according to a preferred embodiment of the present invention.
Figure 2B:
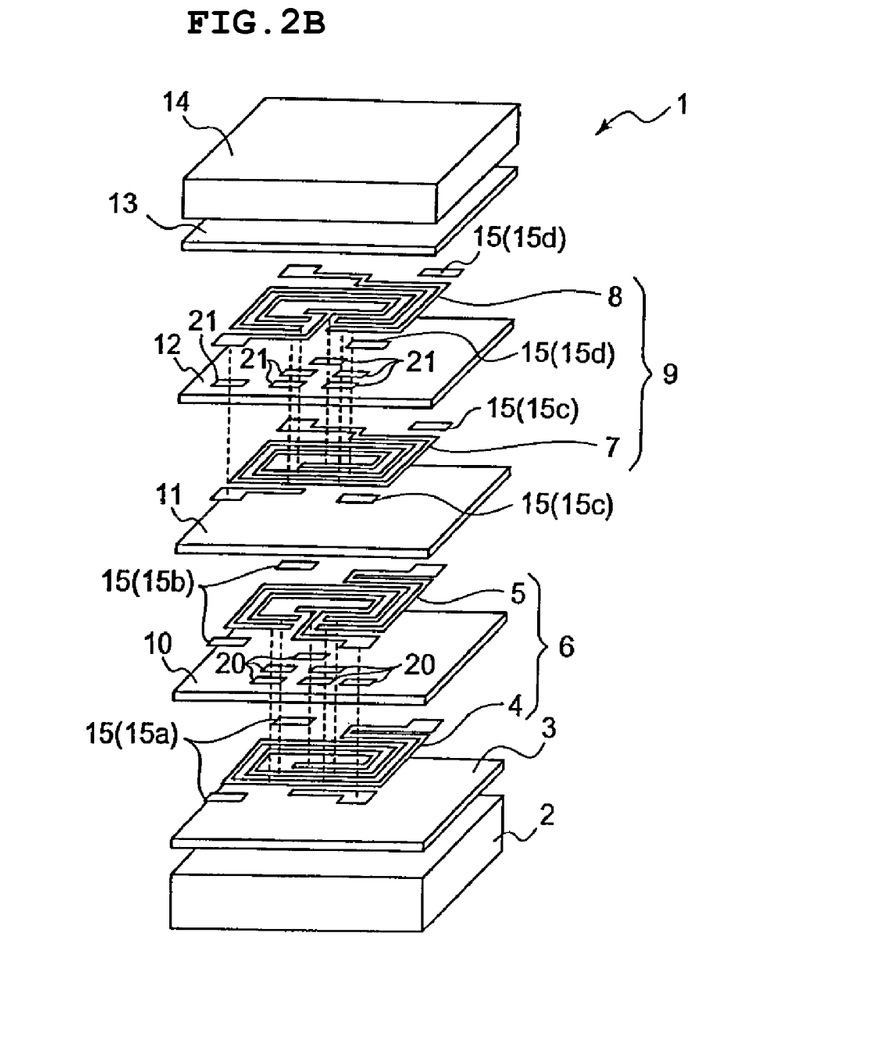
FIG. 2B is a schematic exploded view of the electronic component shown in FIG. 2A.

In a schematic perspective view of FIG. 2A and a schematic exploded view of FIG. 2B, a coil component (common mode choke coil component) 1, which is an electronic component of this preferred embodiment, is shown. This coil component 1 includes a base-side magnetic substrate 2, an underlying insulating layer 3, a primary coil 6 made of conductive patterns 4 and 5 which are coil patterns, a secondary coil 9 made of conductive patterns 7 and 8 which are coil patterns, conductive pattern-interlayer insulating layers 10, 11, and 12, a protective insulating layer 13, a lid-side magnetic substrate 14, floating dummy patterns 15, and exterior connection electrodes 16 (16a, 16b) and 17 (17a, 17b).

Figure 1:
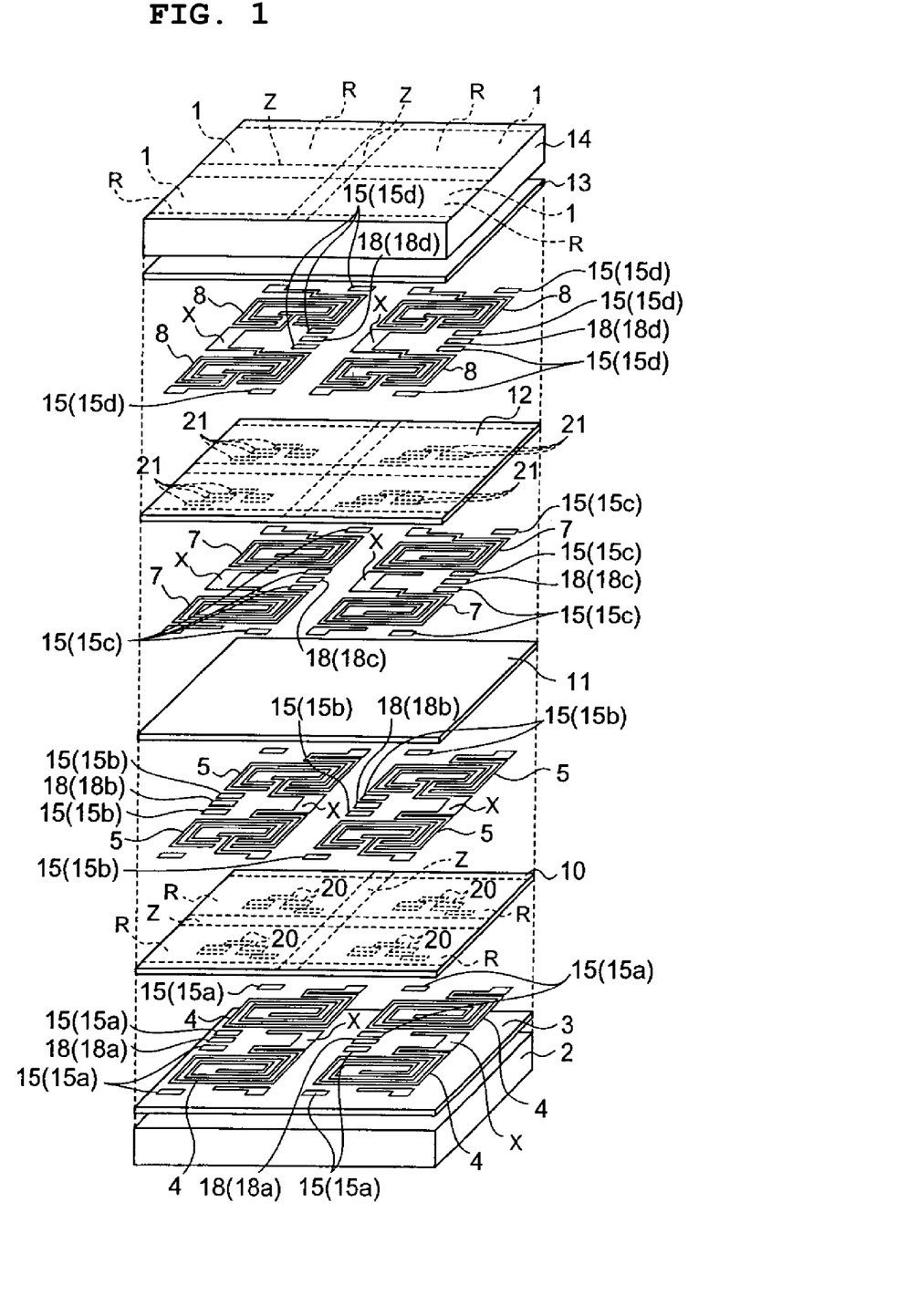
FIG. 1 is a view for illustrating a method for manufacturing electronic components according to a preferred embodiment of the present invention.

The structure of this coil component 1 will be described together with respect to a preferred embodiment of its manufacturing process. In the manufacturing process of the coil component 1, first of all, the base-side magnetic substrate 2 is prepared from which a plurality of the coil components 1 as shown in FIG. 1 can be formed. Subsequently, the underlying insulating layer 3 is formed by lamination on the entire upper surface of the base-side magnetic substrate 2. As a substrate for forming the base-side magnetic substrate 2 and the lid-side magnetic substrate 14, for example, a ferrite substrate, a ceramic substrate including a magnetic material, and a resin substrate including a magnetic material may be used. By using substrates that are appropriately selected from the substrates mentioned above, the base-side magnetic substrate 2 and the lid-side magnetic substrate 14 are formed. In addition, as an insulating material forming the individual insulating layers including the underlying insulating layer 3, the conductive pattern-interlayer insulating layers 10 to 12, and the protective insulating layer 13, for example, resin materials such as a polyimide resin, an epoxy resin, and a benzocyclobutene resin, photosensitive resin materials, glass materials such as $SiO_2$, and glass ceramics may be used. By using insulating materials appropriately selected from the insulating materials mentioned above, the individual insulating layers are formed.

Next, at the upper side of the underlying insulating layer 3, the electronic component-forming conductive patterns 4 are formed by lamination in respective predetermined electronic component-forming regions R, and in addition, the floating dummy patterns 15 (15a) are also formed which are not electrically connected to the electronic component-forming conductive patterns 4. In addition, in a predetermined cutting-removal region Z which is to be removed by cutting in a cutting step to be described later, removal dummy patterns 18 (18a) are formed. In the example shown in FIG. 1, adjacent electronic component-forming conductive patterns 4 are formed in a direction that is substantially perpendicular to the plane of the figure so that adjacent ends of the conductive patterns 4 extend and are then connected to each other. That is, an extension forming portion of the conductive patterns 4 is an extension conductor which is formed so as to extend from the electronic component-forming regions R and so as to intersect the cutting-removal region Z.

Incidentally, an allowable range is obtained beforehand and is determined in which, even when a cutting position is shifted in a cutting step which will be described later, the properties of the coil component 1 are not substantially degraded by the shift of the cutting position. In view of the shift of cutting position within the allowable range, the formation position and the width of the removal dummy pattern 18 (18a) are determined so as to be reliably cut and removed. In addition, in this example, the formation position of the removal dummy pattern 18a is also determined in view of the following points. That is, in the electronic component-forming conductive patterns 7 and 8, which are formed by lamination at the upper side of the electronic component-forming conductive patterns 4, as is the case of the conductive patterns 4, adjacent electronic component-forming conductive patterns 7 in the direction that is substantially perpendicular to the plane are formed so that adjacent ends of the conductive patterns 7 extend and are then connected to each other, and adjacent electronic component-forming conductive patterns 8 in the same direction as described above are formed so that adjacent ends of the conductive patterns 8 extend and are then connected to each other. A connection portion (extension conductor) X of the conductive patterns 7 and that of the conductive patterns 8 are each formed so as to extend from the electronic component-forming regions R and so as to intersect the cutting-removal region Z. In this preferred embodiment, the removal dummy patterns 18a are formed at positions which are overlapped with those of the connection portions (extension conductors) X of the electronic component-forming conductive patterns 7 and 8, the connection portions (extension conductors) X being formed in the cutting-removal region Z.

In this preferred embodiment, in view of the shift of cutting position in the cutting step within the allowable range, the floating dummy pattern 15 (15a) is provided at a position in the vicinity of the outside of the cutting-removal region Z at an interval therefrom so as not to be exposed at the side surface (cut surface) of the electronic component 1 and is also provided adjacent to the removal dummy pattern 18a at an interval therefrom.

As a method for forming a first conductive pattern layer including the electronic component-forming conductive patterns 4, the floating dummy patterns 15a, and the removal dummy patterns 18a, various method may be used. However, as one example, a method using a photolithographic technique will be described.

When a photolithographic technique is used, for example, first of all, by using a film forming technique (such as a thin-film forming technique including sputtering or evaporation, or a thick-film forming technique including screen printing), a conductive material film for forming the conductive patterns 4, 15a, and 18a is formed over the entire upper surface of the underlying insulating layer 3. As the conductive material, for example, a metal such as Ag, Pb, Cu, or Al, or an alloy thereof may be used. In addition, it is preferable that a conductive material for forming the conductive patterns and an insulating material for forming the insulating layers 3 and 10 to 13 be selected based on machinability of each, adhesion between the conductive pattern and the insulating layer, and other factors. For example, the insulating layers may be formed of a polyimide resin and the conductive patterns may be formed of Ag.

After the conductive material film is formed over the entire upper surface of the underlying insulating layer 3, a resist film is formed on the entire surface of the conductive material film. Next, at the upper side of the resist film, a mask for forming the conductive patterns 4, 15a, and 18a is formed. Subsequently, by using this mask, only portions of the resist film which form the conductive patterns 4, 15a, and 18a are irradiated with light, such as ultraviolet rays, for photo-curing. Next, by development treatment, uncured portions of the resist film are removed. Subsequently, portions of the conductive material on which the resist film is not formed are removed, for example, by etching to form the conductive patterns 4, 15a, and 18a. Then, the resist film remaining on the conductive patterns 4, 15a, and 18a is removed. With the photolithographic technique described above, the conductive patterns 4, the floating dummy patterns 15a and the removal dummy patterns 18a are formed from the same material and in the same process, so that the first conductive pattern layer including the conductive patterns 4, 15a, and 18a is formed.

At the upper side of the first conductive pattern layer, the conductive pattern-interlayer insulating layer 10 is formed by lamination. In this conductive pattern-interlayer insulating layer 10, via holes 20 are formed for connecting between the electronic component-forming conductive patterns 4 and 5 which are adjacent to each other in the up and down direction with the insulating layer 10 provided therebetween. In order to form the via holes 20, for example, the conductive pattern-interlayer insulating layer 10 may be formed using a photolithographic technique as described below.

For example, over the entire upper surface of the first conductive pattern layer, a photosensitive insulating material for forming the conductive pattern-interlayer insulating layer 10 is formed by lamination. A mask for forming via holes is disposed at the upper side of this insulating material, and by using this mask, portions of the insulating material region except for portions at which the via holes 20 are to be formed are irradiated with light, such as ultraviolet rays, for photo-curing. Subsequently, uncured portions of the insulating material are removed by a development treatment. Accordingly, the via holes 20 are formed. As described above, the conductive pattern-interlayer insulating layer 10 provided with the via holes 20 is formed.

At the upper side of the conductive pattern-interlayer insulating layer 10, the electronic component-forming conductive patterns 5 are formed in the respective electronic component formation regions R by lamination, and in addition, the floating dummy patterns 15 (15b) are also formed which are not electrically connected to the electronic component-forming conductive patterns 5. Furthermore, in the cutting-removal region Z, the removal dummy patterns 18 (18b) are formed.

The electronic component-forming conductive patterns 5 are formed so as to be substantially overlapped with the electronic component-forming conductive patterns 4 of the first conductive pattern layer. As with the conductive patterns 4, adjacent electronic component-forming conductive patterns 5 in the direction that is substantially perpendicular to the plane of FIG. 1 are formed so that adjacent ends of the conductive patterns 5 extend and are then connected to each other. The connection portion (extension conductor) X is provided so as to intersect the cutting-removal region Z, and the connection portion X is disposed at a position which is overlapped with that of the connection portion X of the conductive patterns 4 with the conductive pattern-interlayer insulating layer 10 provided therebetween. In addition, as with the floating dummy patterns 15a and the removal dummy patterns 18a of the first conductive pattern layer, the formation position and the width of each of the floating dummy patterns 15b and the removal dummy patterns 18b are determined with reference to the shift of cutting position. In this preferred embodiment, the floating dummy patterns 15b and the removal dummy patterns 18b are arranged so as to be overlapped with the floating dummy patterns 15a and the removal dummy patterns 18a, respectively, with the conductive pattern-interlayer insulating layer 10 provided therebetween.

A second conductive pattern layer including the electronic component-forming conductive patterns 5, the floating dummy patterns 15b, and the removal dummy patterns 18b as described above is formed, for example, by using a photolithographic technique similar to the first conductive pattern layer. In addition, a portion of the conductive material forming the conductive patterns 5, 15b, and 18b enters the via holes 20 formed in the conductive pattern-interlayer insulating layer 10. Due to the via holes 20, adjacent conductive patterns 4 and 5 in the up and down direction with the conductive pattern-interlayer insulating layer 10 provided therebetween are electrically connected to each other.

After the formation of the second conductive pattern layer, the conductive pattern-interlayer insulating layer 11 is formed at the upper side of the second conductive pattern layer. At the upper side of the conductive pattern-interlayer insulating layer 11, the electronic component-forming conductive patterns 7 are formed by lamination in the respective electronic component-forming regions R, and in addition, the floating dummy patterns 15 (15c) are also formed which are not electrically connected to the electronic component-forming conductive patterns 7. In addition, in the cutting-removal region Z, the removal dummy patterns 18 (18c) are formed.

The electronic component-forming conductive patterns 7 are formed so as to be overlapped with the positions at which the electronic component-forming conductive patterns 4 and 5 of the first and the second conductive pattern layers, respectively, are formed. As is the case of the conductive patterns 4 and 5, adjacent electronic component-forming conductive patterns 7 in the direction that is substantially perpendicular to the plane of FIG. 1 are formed so that adjacent one-ends of the conductive patterns 7 extend and are then connected to each other. The connection portion (extension conductor) X is arranged so as to intersect the cutting-removal region Z. However, the position at which the connection portion X is disposed is different from that of the connection portions X of the conductive patterns 4 and 5, and in this example, the connection portion X is disposed at a position which is overlapped with that of the removal dummy patterns 18a and 18b.

Similar to the removal dummy patterns 18a and 18b, in view of the shift of cutting position, the removal dummy pattern 18c is formed so as to have a size which allows it to be disposed within the cutting-removal region Z. The removal dummy pattern 18c is disposed at a position which is overlapped with that of the connection portions (extension conductors) X of the conductive patterns 4 and 5. Similar to the floating dummy patterns 15a and 15b, the floating dummy pattern 15c is arranged adjacent to the removal dummy pattern 18c at an interval therefrom in view of the shift of cutting position and is disposed at a position which is overlapped with that of the connection portions X of the conductive patterns 4 and 5.

A third conductive pattern layer including the electronic component-forming conductive patterns 7, the floating dummy patterns 15c, and the removal dummy patterns 18c as described above is formed using a photolithographic technique, similar to the first and the second conductive pattern layers. At the upper side of the third conductive pattern layer, the conductive pattern-interlayer insulating layer 12 is formed by lamination. In this conductive pattern-interlayer insulating layer 12, via holes 21 are formed for connecting between the electronic component-forming conductive patterns 7 and 8. The conductive pattern-interlayer insulating layer 12 can also be formed using a photolithographic technique similar to the conductive pattern-interlayer insulating layer 10.

At the upper side of the conductive pattern-interlayer insulating layer 12, the electronic component-forming conductive patterns 8 are formed by lamination in the respective electronic component-forming regions R, and in addition, the floating dummy patterns 15 (15d) are also formed which are not electrically connected to the electronic component-forming conductive patterns 8. In addition, in the cutting-removal region Z, the removal dummy patterns 18 (18d) are formed. With the conductive patterns 8, the floating dummy patterns 15d, and the removal dummy patterns 18d, a fourth conductive pattern layer is formed.

Figure 3A:
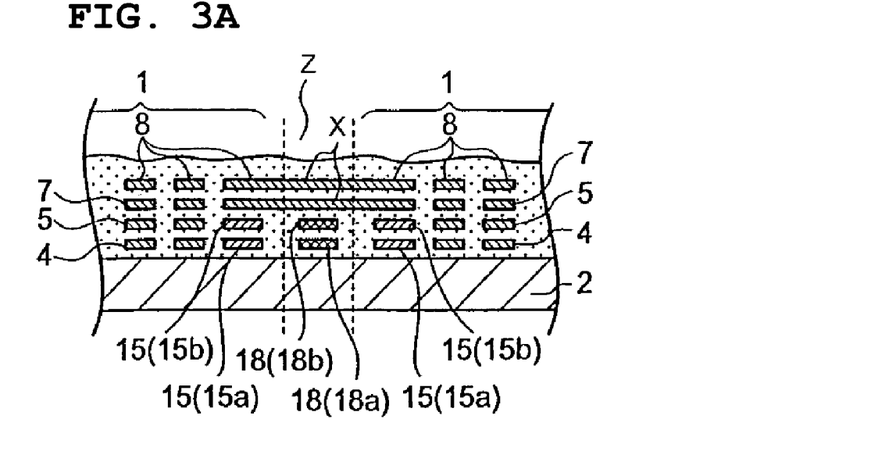
FIG. 3A is a schematic cross-sectional view for illustrating an example of a laminate structure in a region in which removal dummy patterns and floating dummy patterns of a mother substrate are formed.

The electronic component-forming conductive patterns 8 are formed so as to be approximately overlapped with the electronic component-forming conductive patterns 4, 5, and 7 of the first to third conductive pattern layers. Similar to the conductive patterns 7, adjacent electronic component-forming conductive patterns 8 in the direction that is substantially perpendicular to the plane of FIG. 1 are formed so that adjacent ends of the conductive patterns 8 extend and are then connected to each other. The connection portion (extension conductor) X is arranged so as to intersect the cutting-removal region Z, and the connection portion (extension conductor) X is disposed at a position which is overlapped with that of the connection portion X of the conductive patterns 7. That is, in this example, as shown in a schematic cross-sectional view of FIG. 3A, the removal dummy pattern 18a of the first conductive pattern layer, the removal dummy pattern 18b of the second conductive pattern layer, the connection portion (extension conductor) X of the conductive patterns 7 of the third conductive pattern layer, and the connection portion (extension conductor) X of the conductive patterns 8 of the fourth conductive pattern layer are arranged so as to be overlapped with each other. In other words, in the other conductive pattern layers (that is, the third and fourth conductive pattern layers) in which the removal dummy patterns are not provided at positions which are overlapped with those of the removal dummy patterns 18a and 18b of the first and the second conductive pattern layers, the connection portions (extension conductors) X of the electronic component-forming conductive patterns 7 and 8 are provided at positions which are overlapped with those of the removal dummy patterns 18a and 18b.

Figure 3B:
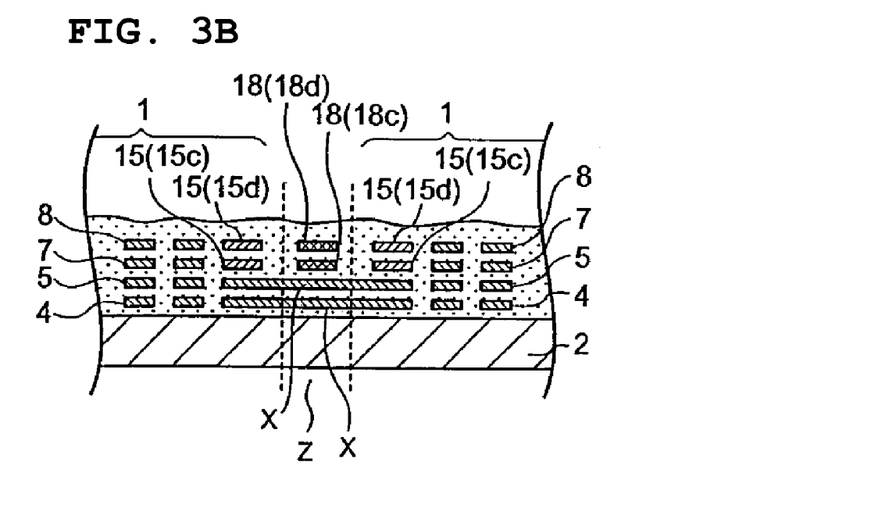
FIG. 3B is a schematic cross-sectional view for illustrating an example of a laminate structure in a region in which removal dummy patterns and floating dummy patterns of a mother substrate are formed at positions different from those shown in FIG. 3A.

Similar to the removal dummy patterns 18a to 18c, in view of the shift of cutting position within the allowable range, the removal dummy pattern 18d is formed so as to have a size which allows it to be disposed within the cutting-removal region Z. The removal dummy pattern 18d is disposed at a position which is overlapped with that of the removal dummy pattern 18c. That is, in this example, as shown in a schematic cross-sectional view of FIG. 3B, the connection portion X of the conductive patterns 4 of the first conductive pattern layer, the connection portion X of the conductive patterns 5 of the second conductive pattern layer, the removal dummy pattern 18c of the third conductive pattern layer, and the removal dummy pattern 18d of the fourth conductive pattern layer are arranged so as to be overlapped with each other. In other words, in the other conductive pattern layers (that is, the first and the second conductive pattern layers) in which the removal dummy patterns are not provided at positions which are overlapped with those of the removal dummy patterns 18c and 18d of the third and the fourth conductive pattern layers, the connection portions (extension conductors) X of the electronic component-forming conductive patterns 4 and 5 are provided at positions which are overlapped with those of the removal dummy patterns 18c and 18d.

Similar to the floating dummy patterns 15a to 15c, the floating dummy pattern 15d is provided adjacent to the removal dummy pattern 18d at an interval therefrom in view of the shift of cutting position and is disposed so as to be overlapped with the floating dummy pattern 15c of the third conductive pattern layer. In this preferred embodiment, when the cross section of the laminate along the line passing through the floating dummy patterns 15c and 15d is observed, in all the first to the fourth conductive pattern layers, the floating dummy patterns 15 or the electronic component-forming conductive patterns are formed.

The fourth conductive pattern layer described above can also be formed using a photolithographic technique similar to the first to the third conductive pattern layers. At the upper side of the fourth conductive pattern layer, the protective insulating layer 13 is formed by lamination.

Subsequently, the lid-side magnetic substrate 14 is disposed at the upper side of the protective insulating layer 13. In this step, an adhesive (such as thermosetting polyimide resin) is applied to a surface of the protective insulating layer 13 and a surface of the lid-side magnetic substrate 14, the surfaces facing each other.

Next, in a vacuum or an inert gas atmosphere, while being heated, the laminate including the magnetic substrates 2 and 14, the first to the fourth conductive pattern layers, and the insulating layers 3 and 10 to 13 is pressed, so that the lid-side magnetic substrate 14 and the protective insulating layer 13 are bonded to each other. Subsequently, after this laminate is cooled, the pressure applied thereto is released. As described above, a mother substrate is formed from which a great number of the coil components 1 can be obtained by cutting.

After the mother substrate is formed, the laminate that was pressed previously is cut into individual electronic components 1, for example, by dicing along the cutting lines provided along the boundaries of the individual electronic component-forming regions R. At side surfaces (cut surfaces) of each separated electronic component 1, end surfaces of the extension conductors of the conductive patterns 4, 5, 7, and 8 are exposed.

Subsequently, for each electronic component 1, the exterior connection electrodes 16 (16a, 16b) and 17 (17a, 17b) are formed at respective positions at which the end surfaces of the extension conductors of the conductive patterns 4, 5, 7, and 8 are exposed. Accordingly, first end sides of the conductive patterns 4 and 5 and second end sides thereof are electrically connected to the outside via the exterior connection electrode 16a and the exterior connection electrode 16b, respectively. Furthermore, the first end sides of the conductive patterns 7 and 8 and the second end sides thereof are electrically connected to the outside via the exterior connection electrode 17a and the exterior connection electrode 17b, respectively.

The exterior connection electrodes 16 and 17 each can be provided by forming an underlying electrode film made of a conductive material such as Ag, Cu, NiCr, or NiCu using a conductive paste application technique or a film forming technique such as sputtering or evaporation, followed by formation of a metal film made of Ni, Sn, Sn—Pb or other suitable metal film on the upper side of the underlying electrode film, for example, using a wet electrolytic plating.

As described above, the coil components 1 are formed. In this preferred embodiment, since the removal dummy patterns 18 and the floating dummy patterns 15 are formed in regions of the conductive pattern layer other than those in which the electronic component-forming conductive patterns 4, 5, 7, and 8 are formed, when the protective insulating layer 13 is formed at the upper side of the fourth conductive pattern layer, the irregularities of the upper surface of the protective insulating layer 13 are reduced and planarized. Thus, when the lid-side magnetic substrate 14 is disposed at the upper side of the protective insulating layer 13, followed by application of a pressure, a pressing force is approximately uniformly applied to the entire laminate.

Accordingly, the generation of delamination caused by a non-uniformly applied pressing force is prevented.

In particular, in this preferred embodiment, the removal dummy pattern 18 and the floating dummy patterns 15 are disposed so as to be overlapped with the connection portion (extension conductor) X of the conductive patterns. In other words, at positions which are most responsible for forming the exterior connection electrodes 16 and 17 (that is, of regions in which delamination is liable to occur in the past, at positions at which a delamination problem most seriously occurs), the removal dummy patterns 18 and the floating dummy patterns 15 are disposed, so that the generation of delamination is prevented.

In addition, in this example, in view of the shift of cutting position, the removal dummy pattern 18 is formed to have a relatively small width so as to be disposed within the cutting-removal region Z. However, since the floating dummy pattern 15 is provided adjacent to the corresponding removal dummy pattern 18 at an interval therefrom, even when the removal dummy pattern 18 is has a relatively small width, the generation of a large gap between the patterns is avoided, which may cause a very large depression of the insulating layer. Accordingly, since the irregularities of the upper surface of the protective insulating layer 13 of the laminate are reduced, the generation of delamination is prevented as described above.

Furthermore, in this preferred embodiment, the floating dummy patterns 15 and the removal dummy patterns 18 are designed so that although the cutting position is shifted, when this shift is within an allowable range determined beforehand, the end surfaces of the dummy patterns 15 and 18 are not exposed at the side surfaces (cut surfaces) of the coil component 1. Thus, the generation of problems, such as migration between the dummy pattern and the electronic component-forming conductive pattern, is prevented. Accordingly, the degradation in electrical properties of the electronic component is prevented, and a highly reliable electronic component having high performance is easily provided.

Furthermore, in this preferred embodiment, the floating dummy patterns 15 and the removal dummy patterns 18 are formed along layer surfaces of the respective conductive pattern layer, and the floating dummy patterns 15 and the removal dummy patterns 18 are formed from the same material as that for forming the electronic component-forming conductive patterns 4, 5, 7, and 8 of the respective conductive pattern layers and are formed simultaneously therewith. Thus, while the increase in the number of manufacturing steps and the increase in material cost are suppressed, the superior results as described above are obtained.

Furthermore, in this preferred embodiment, for example, in the third and fourth conductive pattern layers which do not have the removal dummy patterns at positions which are overlapped with those of the removal dummy patterns 18a of the first conductive pattern layer, the extension conductors X of the conductive patterns 7 and 8 are formed at positions which are overlapped with those of the removal dummy patterns 18a. As described above, in this preferred embodiment, in at least one of the other conductive pattern layers which do not include the removal dummy patterns at positions which are overlapped with the removal dummy patterns of one conductive pattern layer, the extension conductors of the electronic component-forming conductive patterns are formed at positions which are overlapped with the removal dummy patterns of the one conductive pattern layer. Accordingly, the irregularities of the upper surface of the laminate at places at which the extension conductors of the conductive patterns are formed are reduced.

In addition, when a conductive pattern layer, which does not include floating dummy patterns at portions of the laminate at which floating dummy patterns are formed, is designed to have electronic component-forming conductive patterns so as to be overlapped with the above floating dummy patterns, in all the laminated conductive pattern layers in the floating dummy pattern-forming region, the floating dummy patterns or the electronic component-forming conductive patterns are formed so as to be overlapped with each other, and thus, the irregularities of the upper surface of the laminate are effectively reduced.

In this preferred embodiment, the conductive pattern layers and the insulating layers are formed using a photolithographic technique. Thus, by highly precise machining using a photolithographic technique, the conductive pattern layers and the insulating layers are formed substantially as designed. Accordingly, the variation in electrical properties of the electronic component is prevented, and additional improvement in reliability of the electrical properties is easily achieved.

Figure 4:
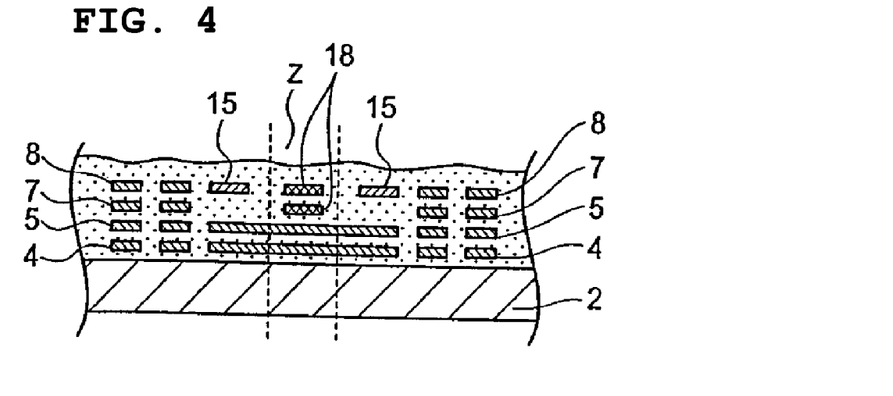
FIG. 4 is a schematic cross-sectional view for illustrating another example.

The present invention is not limited to this preferred embodiment, and various preferred embodiments may be performed. For example, in this preferred embodiment, as shown in a cross-sectional view of FIG. 3A, in all of the second to the fourth conductive pattern layers, the floating dummy patterns 15 or portions of the electronic component-forming conductive patterns 7 and 8 are formed at positions which are overlapped with those of the floating dummy patterns 15a of the first conductive pattern layer. As described above, in this preferred embodiment, at the positions of all the other conductive pattern layers which are overlapped with the floating dummy patterns of one conductive pattern layer, respective floating dummy patterns or portions of the electronic component-forming conductive patterns are formed. On the other hand, for example, as shown by a schematic cross-sectional view of FIG. 4, of all the other conductive pattern layers which are overlapped with the floating dummy patterns 15 of one conductive pattern layer, a conductive pattern layer may be provided in which the floating dummy patterns 15 and portions of the electronic component-forming conductive patterns are not formed at positions which are overlapped with those of the above floating dummy patterns 15 of the one conductive pattern layer. In addition, the same situations can also be applied to the removal dummy patterns 18. That is, of all the other conductive pattern layers which are overlapped with the removal dummy patterns 18 of one conductive pattern layer, a conductive pattern layer may be provided in which the removal dummy patterns 18 and portions of the electronic component-forming conductive patterns are not formed at positions which are overlapped with those of the above removal dummy patterns 18 of the one conductive pattern layer.

In addition, in this preferred embodiment, the floating dummy patterns 15 and the removal dummy patterns 18 are disposed at positions which are overlapped with those of the connection portions (extension conductors) X of the electronic component-forming conductive patterns. However, the floating dummy patterns 15 and the removal dummy patterns 18 may be disposed at positions which are not overlapped with those of the electronic component-forming conductive patterns. In this case, for example, in the cutting-removal region Z, the removal dummy patterns 18 may be formed in all of the first to the fourth conductive pattern layers or may be formed only in three conductive pattern layers or less which are selected beforehand from the first to the fourth conductive pattern layers. When the floating dummy patterns 15 are provided at positions which are not overlapped with those of the electronic component-forming conductive patterns, the floating dummy patterns 15 may be formed in all of the first to the fourth conductive pattern layers or may be formed only in three conductive pattern layers or less which are selected beforehand from the first to the fourth conductive pattern layers.

Furthermore, in this preferred embodiment, although the coil component 1 preferably uses a magnetic substrate, instead of the magnetic substrate, for example, a dielectric substrate may be provided. As an insulating material forming this dielectric substrate, for example, a resin material, such as a polyimide resin, an epoxy resin, or a benzocyclobutene resin, a photosensitive resin material, a glass material such $SiO_2$, and a dielectric ceramic such as a glass ceramic or $BaTiO_3$ may be used. In addition, in this preferred embodiment, although the substrates are preferably provided on both sides of the laminate, which is formed by alternately laminating the conductive pattern layers and the insulating layers, in the up and down direction, for example, instead of at least one substrate provided on the top or the bottom side, a protective layer may be provided which is formed by applying a molten insulating material, followed by curing. As described above, on both sides of the laminate in the up and down direction, the substrates are not always necessarily provided.

Furthermore, in this preferred embodiment, the present invention is described with reference to the coil component (common mode choke coil component) by way of example. However, when the structure is used in which conductive pattern layers are laminated to each other with at least one insulating layer provided therebetween, the present invention may be applied to electronic components other than a common mode choke coil component, to a method for manufacturing the electronic component, and to a mother substrate for forming many electronic components.

By forming the structure according to preferred embodiments of the present invention, a compact and high-performance electronic component is provided. Thus, the present invention is effectively applied to an electronic component to be incorporated in a device which is required to be reduced in size, to a method for manufacturing electronic components, and to a mother substrate for forming many electronic components.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for manufacturing electronic components, in which conductive pattern layers are laminated to each other with insulating layers provided therebetween to form an integrated laminate, the method comprising the steps of:
    alternately laminating the insulating layers and conductive pattern layers including conductive patterns which are formed at intervals therebetween in layer surface directions to form a laminate in which laminate portions of electronic component-forming conductive patterns are collectively formed;
    applying a force to the laminate in a lamination direction to form an integrated laminate;
    after the force is applied to the laminate in the lamination direction to form the integrated laminate, cutting the laminate along cutting lines provided along boundaries of the laminate portions of the electronic component-forming conductive patterns so as to separate electronic components from each other;
    forming at least one removal dummy pattern in at least one of the conductive pattern layers which are to be laminated to each other before one of the insulating layers is provided on a surface of said at least one of the conductive pattern layers, the at least one removal dummy pattern having a size that allows it to be disposed within a cutting-removal region which is a region to be cut and removed by the step of cutting the laminate;
    forming at least one floating dummy pattern in at least one of the conductive pattern layers of the laminate portions of the electronic component-forming conductive patterns so as to be disposed in the vicinity of an outside of the cutting-removal region at an interval therefrom before one of the insulating layers is formed by lamination on a surface of said at least one conductive pattern layer, the at least one floating dummy pattern not being electrically connected to the electronic component-forming conductive patterns; and
    the at least one removal dummy pattern is not exposed at end surfaces of separated electronic components.

2. The method for manufacturing electronic components, according to claim 1, wherein the at least one floating dummy pattern and the at least one removal dummy pattern are disposed in at least one of the conductive pattern layers so as to be adjacent to each other at an interval therebetween in a layer surface direction of said at least one of the conductive pattern layers, and electronic component-forming conductive patterns of said at least one of the conductive pattern layers, said at least one floating dummy pattern, and said at least one removal dummy pattern are formed from the same material and are also formed in the same step.

3. The method for manufacturing electronic components, according to claim 1, wherein one of the conductive pattern layers is provided which does not include the at least one removal dummy pattern at a position which is overlapped with that of the at least one removal dummy pattern of another one of the conductive pattern layers, at least one extension conductor is formed in said one conductive pattern layer from electronic component-forming conductive patterns thereof so as to intersect the cutting-removal region, and said at least one removal dummy pattern of said another conductive pattern layer and said at least one extension conductor of said one conductive pattern layer are provided at positions which are overlapped with each other.

4. The method for manufacturing electronic components, according to claim 3, wherein conductive patterns of one of the conductive pattern layers are provided, said one conductive pattern layer having no floating dummy pattern at a position which is overlapped with that of the at least one floating dummy pattern of another one of the conductive pattern layers, and the at least one floating dummy pattern of said another conductive pattern layer and a portion of the conductive patterns of said one conductive pattern layer are provided at positions which are overlapped with each other.

5. The method for manufacturing electronic components, according to claim 1, wherein conductive patterns of one of the conductive pattern layers are provided, said one conductive pattern layer having no floating dummy pattern at a position which is overlapped with that of the at least one floating dummy pattern of another one of the conductive pattern layers, and the at least one floating dummy pattern of said another conductive pattern layer and a portion of the conductive patterns of said one conductive pattern layer are provided at positions which are overlapped with each other.

6. The method for manufacturing electronic components, according to claim 1, wherein the conductive pattern layers and the insulating layers are formed using a photolithographic technique.

7. The method for manufacturing electronic components, according to claim 1, wherein the electronic component-forming conductive patterns have a coil pattern shape, and the electronic components are coil components.

8. A mother substrate for forming many electronic components, comprising:
conductive pattern layers having conductive patterns which are formed at intervals therebetween in layer surface directions; and
insulating layers which are alternately arranged with the conductive pattern layers to form a laminate in which laminate portions of electronic component-forming conductive patterns are collectively provided, the laminate being arranged to be cut along cutting lines provided along boundaries of the laminate portions of the electronic component-forming conductive patterns so as to separate the electronic components from each other; wherein
in at least one of the conductive pattern layers, at least one removal dummy pattern is provided and has a size that allows it to be entirely disposed within a cutting-removal region which is to be cut away along the cutting lines;
in at least one conductive pattern layers of the laminate portions of the electronic component-forming conductive patterns, at least one floating dummy pattern which is not electrically connected to the electronic component-forming conductive patterns is provided in the vicinity of the outside of the cutting-removal region at an interval therefrom; and
the at least one removal dummy pattern is spaced apart from the cutting lines.

9. The mother substrate for forming many electronic components, according to claim 8, wherein the at least one floating dummy pattern and the at least one removal dummy pattern are disposed in at least one of the conductive pattern layers so as to be adjacent to each other at an interval therebetween, and electronic component-forming conductive patterns of said at least one of the conductive pattern layers, said at least one floating dummy pattern, and said at least one removal dummy pattern are formed from the same material.

10. The mother substrate for forming many electronic components, according to claim 8, wherein in at least one of other conductive pattern layers having no removal dummy pattern at a position which is overlapped with at least one removal dummy pattern of one of the conductive pattern layers, at least one extension conductor is arranged to extend from electronic component-forming conductive patterns of said at least one of other conductive pattern layers to intersect the cutting-removal region, and said at least one removal dummy pattern of said one conductive pattern layer and said at least one extension conductor of said at least one of other conductive pattern layers are provided at positions which are overlapped with each other.

11. The mother substrate for forming many electronic components, according to claim 10, wherein in at least one of other conductive pattern layers having no floating dummy pattern at a position which is overlapped with the at least one floating dummy pattern of one of the conductive pattern layers, a portion of electronic component-forming conductive patterns of said at least one of other conductive pattern layers is disposed at a position which is overlapped with that of said at least one floating dummy pattern of said one conductive pattern layer.

12. The mother substrate for forming many electronic components, according to claim 8, wherein in at least one of other conductive pattern layers having no floating dummy pattern at a position which is overlapped with the at least one floating dummy pattern of one of the conductive pattern layers, a portion of electronic component-forming conductive patterns of said at least one of other conductive pattern layers is disposed at a position which is overlapped with that of said at least one floating dummy pattern of said one conductive pattern layer.

13. The mother substrate for forming many electronic components, according to claim 8, wherein the conductive pattern layers and the insulating layers are formed using a photolithographic technique.

14. The mother substrate for forming many electronic components, according to claim 8, wherein the electronic component-forming conductive patterns have a coil pattern shape, and the electronic components are coil components.

15. An electronic component comprising:
conductive pattern layers; and
insulating layers which are alternately arranged with the conductive pattern layers to form a laminate in which the conductive pattern layers are integrally laminated to each other; wherein
in at least one of the conductive pattern layers, at least one floating dummy pattern which is not electrically connected to a corresponding conductive pattern is disposed in a region between an end surface of said at least one of the conductive pattern layers and the conductive pattern at an interval therefrom so as not to be exposed at the end surface of said at least one of the conductive pattern layers; and
no conductive patterns are disposed between one end surface of each of the insulating layers and the at least one floating dummy pattern wherein the electronic component-forming conductive patterns have a coil pattern shape, and the electronic component is a coil component.

16. The electronic component according to claim 15, wherein the conductive pattern layers include extension conductors which extend from the conductive patterns to end surfaces of the conductive pattern layers, conductive pattern layers having extension conductors provided at positions different from each other are included in the conductive pattern layers, and of the conductive pattern layers having extension conductors provided at positions different from each other, in a region of one of the conductive pattern layers in which no floating dummy pattern is provided and which is overlapped with a region of another one of the conductive pattern layers in which at least one extension conductor is provided, the at least one floating dummy pattern is provided.

* * * * *